United States Patent [19]

Kanno et al.

[11] Patent Number: 5,129,198
[45] Date of Patent: Jul. 14, 1992

[54] CLEANING DEVICE FOR SEMICONDUCTOR WAFERS

[75] Inventors: Itaru Kanno; Nobuyoshi Hattori; Takaaki Fukumoto, all of Itami; Masuo Tada, Yao, all of Japan

[73] Assignees: Taiyo Sanso Co., Ltd.; Mitsubishi Denki Kabushiki Kaisha, both of Japan

[21] Appl. No.: 643,289

[22] Filed: Jan. 22, 1991

[30] Foreign Application Priority Data

Feb. 9, 1990 [JP] Japan ................................ 2-30375

[51] Int. Cl.⁵ .................................................. B24C 3/12
[52] U.S. Cl. ........................................... 51/410; 51/419; 51/424; 51/321
[58] Field of Search ................ 51/320, 321, 410, 419, 51/424, 426, 425

[56] References Cited

U.S. PATENT DOCUMENTS

| | | | |
|---|---|---|---|
| 3,097,450 | 7/1963 | Freeman et al. | 51/425 |
| 4,649,672 | 3/1987 | Thomann | 51/424 |
| 4,723,378 | 2/1988 | Van Kuiken et al. | 51/424 |
| 4,932,168 | 6/1990 | Tada et al. | 51/436 |
| 4,974,375 | 12/1990 | Tada et al. | 51/419 |

*Primary Examiner*—Bruce M. Kisliuk
*Assistant Examiner*—Eileen Morgan
*Attorney, Agent, or Firm*—Leydig, Voit & Mayer

[57] ABSTRACT

A cleaning device for semiconductor wafers includes a cleaning vessel, a frozen particle supply unit, a jet nozzle for ejecting the frozen particles toward the semiconductor wafer supported within the cleaning vessel, an exhaust duct coupled to the cleaning vessel, and an exhaust blower. First and second exhausts guide to the exhaust duct frozen particles and contaminants from within the cleaning vessel near the wafer and near the walls of the vessel, respectively. The first exhaust includes a first exhaust guide pipe whose upper and lower ends open to an interior of the cleaning vessel near the wafer and to the exhaust duct, respectively. The second exhaust may include a tapered exhaust guide pipe surrounding the first exhaust guide pipe or a plurality of exhaust guide pipes disposed circumferentially uniformly around the first exhaust guide pipe.

11 Claims, 3 Drawing Sheets

F I G. 2
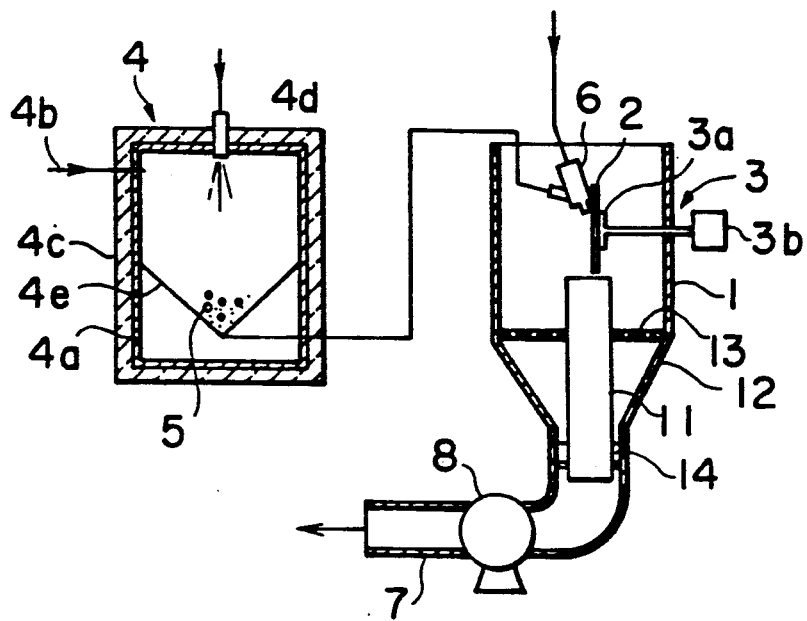

CLEANING DEVICE FOR SEMICONDUCTOR WAFERS

BACKGROUND OF THE INVENTION

This invention relates to cleaning devices for cleaning semiconductor wafers or the like, i.e., glass or disk substrates which must be kept clean, of contaminants and dust adhered to the surfaces thereof to the same cleanliness level as semiconductor wafers.

FIG. 1 shows such a conventional cleaning device for cleaning semiconductor wafers, etc. The cleaning device of FIG. 1 comprises a cleaning vessel 1, in which a cleaned object 2 such as a semiconductor wafer is supported by a support means 3. Fine frozen particles 5 such as ice particles are generated and stored by a frozen particle supply means 4. The fine frozen particles 5 are supplied to a jet means 6 such as a jet nozzle which ejects and sprays the frozen particles 5 towards the object to be cleaned 2 supported by the support means 3. Further, an exhaust duct 7 is coupled at one end to the cleaning vessel 1, for exhausting the frozen particles which have been ejected by the jet means 6 after cleaning the surface of the object 2. In addition, an exhaust blower 8 is disposed at an intermediate portion of the exhaust duct 7 so as to suck and exhaust the air from the cleaning vessel 1 forcibly to the outside.

The above support means 3 comprises a support portion 3a for fixing and supporting the object 2, and a motor 3b for rotating the support portion 3a. On the other hand, the frozen particle supply means 4 comprises a frozen particle generating container 4a, which is supplied, from a refrigerant supply source (not shown), with refrigerant such as liquid nitrogen via a refrigerant supply pipe 4b, and whose walls are surrounded by a heat insulating material 4c; and a spray nozzle 4d, which is coupled to a supply source (not shown) for supplying the liquid, such as ultrapure water, to be frozen in the container 4a, and which sprays the liquid into the frozen particle generating container 4a to generate frozen particles 5.

Next, let us describe the method of operation of the above conventional cleaning device. First, the interior of the frozen particle generating container 4a surrounded by the heat insulating material 4c is refrigerated by means of the vaporization of the refrigerant such as liquid nitrogen therewithin. After the interior of the frozen particle generating conntainer 4a is thus sufficiently refrigerated, the liquid to be frozen, such as ultrapure water, is sprayed from the spray nozzle in the form of fine particles to form fine frozen particles 5 having particle diameters of 20 $\mu$m (micrometers) to 5 mm (millimeters). The frozen particles 5 thus generated are collected in a collector net 4e spread within the frozen particle generating container 4 in the form of a reversed cone; further, they are forwarded to the jet means 6 by means of the ejector principle utilizing a jet of a carrier gas, discharged and blasted therefrom together with the carrier gas against the surface of the object to be cleaned 2, such as a semiconductor wafer fixedly secured to the support portion of the support means 3. The fine frozen particles 5 ejected from the jet means 6 collide with the surface of the object 2 to scrub off therefrom any contaminants, such as fine dust and remnants of resist, adhered thereto. Since, at this time, however, the fine frozen particles 5 are ejected by means of the jet of carrier gas, upward or turbulent flows tend to form within the cleaning vessel 1, due to the jet of carrier gas being reflected by the surface of the object 2 after colliding with it. Thus, the fine frozen particles 5, which have collided with the object 2 and thus contain the contaminants scrubbed off therefrom, or the contaminants themselves which have been scrubbed off from the object 2 by the frozen particles 5, tend to re-adhere to the object 2, due to the upward or turbulent flows of the carrier gas formed within the cleaning vessel 1, or due to the interior surface of the cleaning vessel 1. Thus, the atmosphere within the cleaning vessel 1 is forcibly exhausted by the exhaust blower 8 to the outside via the exhaust duct 7, such that the upward or turbulant flows of the carrier gas are suppressed.

The above conventional cleaning device, however, has the following disadvantage. Namely, in spite of the forced exhausting by means of the exhaust blower 8, the exhausting of the interior of the cleaning vessel 1 is insufficient; that is, although the gas in the portion near to the opening of the exhaust duct 7 to the cleaning vessel 1 is relatively well exhausted, stagnations of the gas develop near the circumferential walls of the cleaning vessel 1 which are spaced far from the opening of the exhaust duct 7 to the cleaning vessel 1. Consequently, the fine frozen particles or the carrier gas ejected from the jet means 6 cannot be sucked into the exhaust duct 7 sufficiently, and hence the upward or turbulent flows of the jet of the gas cannot be suppressed sufficiently. As a result, the frozen particles 5 to which the contaminants scrubbed off from the cleaned object 2, or the contaminants themselves which have been scrubbed off from the cleaned object 2 by the frozen particles 5, cannot be prevented with sufficient effectiveness from adhereing again to the cleaned object 2, or adhering to the interior surface of the cleaning vessel 1.

Further, if all the jet flow of the carrier gas and the frozen particles ejected from the jet means 6 are to be sucked into the exhaust duct 7 so as to prevent the upward or turbulent flows in the case of the conventional cleaning device, then, an exhaust blower 8 having a large exhaust capacity is required, which results in a large-sized device and an increased cost. On the other hand, if the exhaust capacity of the exhaust blower 8 is reduced, the above disadvantage cannot be resolved.

SUMMARY OF THE INVENTION

It is therefore a primary object of this invention to provide a small-sized and inexpensive cleaning device which effectively prevents the upward and turbulant flows of the jet caused by the ejection of the frozen particles without increasing either the exhaust capacity of the exhaust blower or the capacity of the cleaning vessel, and which therefore effectively prevents the contaminants such as dust from re-adhereing to the cleaned object or the interior surface of the cleaning vessel. The above object is accomplished in accordance with the principle of this invention in a cleaning device for cleaning an object to be cleaned, such as a semiconductor wafer, which comprises, in addition to conventional parts, a first exhaust means for guiding to the exhaust duct the atmosphere near the support portion of the support means within the cleaning vessel; and a second exhaust means for guiding to the exhaust duct the atmosphere surrounding the periphery of the support portion of the support means within the cleaning vessel.

Thus, when the frozen particles are ejected from the jet means to clean the cleaned object, the portion of the atmosphere within the cleaning vessel near the support portion of the support means is rapidly guided to the exhaust duct including the frozen particles after the cleaning and the contaminants scrubbed off from the cleaned object. On the other hand, the atmosphere at the periphery of the support portion of the support means is guided, to the exhaust duct slowly and by degrees by means of the second exhaust means. As a result, the upward or turbulent flows due to the jet within the cleaning vessel are effectively suppressed, thereby preventing the contaminants which have once been scrubbed off from readhering to the cleaned object or to the interior surface of the cleaning vessel.

The cleaning device according to this invention has therefore the advantage that the whole device can be rendered small in size and the production cost thereof can be reduced, since the upward or turbulent flows of the jet can be suppressed by means of an exhaust blower of small exhaust capacity.

BRIEF DESCRIPTION OF THE DRAWINGS

The novel features which are believed to be characteristic of this invention are set forth with particularity in the appended claims. This invention itself, however, both as to the structure and method of operation, together with further objects and advantages thereof, may best be understood from the following detailed description of the preferred embodiments, taken in connection with the accompanying drawings, in which:

FIG. 2 is a view similar to that of FIG. 1, but showing a cleaning device according to a first embodiment of this invention;

In the drawings, like reference numerals represent like or corresponding parts.

DETAILED DESCRIPTION OF THE PREFERRED EMBODIMENTS

Referring now to the FIGS. 2 through 5 of the drawings, embodiments according to this invention are described.

Figure 1:
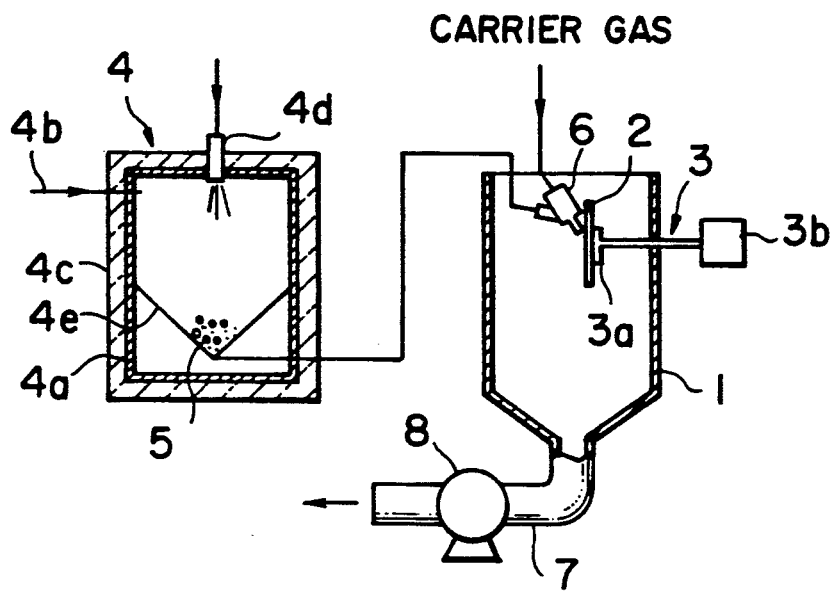
FIG. 1 is a schematic elevational sectional view of a conventional cleaning device for cleaning semiconductor wafers.

A first embodiment according to this invention is shown in FIG. 2, in which the reference numerals 1 through 8 represent parts similar to those represented by the same reference numerals in the conventional cleaning device for semiconductor wafers that is shown in FIG. 1 and described above by reference thereto. Thus, for the structure and method of operation of the parts 1 through 8, reference is made to the description above. In addition, the cleaning device for semiconductor wafers shown in FIG. 2 comprises a first and a second exhaust means: a first exhaust means for guiding the atmosphere within the cleaning vessel 1 in the neighborhood of the support portion 3a of the support means 3; and a second exhaust means for guiding to the exhaust duct 7 the atmosphere within the cleaning vessel 1 surrounding the periphery of the support portion 3a of the support means 3. The first exhaust means consists of a first exhaust guide pipe 11 having one end open to the interior of the cleaning vessel 1 near and just below the support portion 3a of the support means 3 and another other end open to the interior of the exhaust duct 7. On the other hand, the second exhaust means consists of a second exhaust guide pipe 12 which is disposed so as to surround the first exhaust guide pipe 11 and whose upper and lower ends are coupled integrally to the lower end periphery of the cleaning vessel 1 and to the upper end of the exhaust duct 7, respectively. The second exhaust guide pipe 12 has the form of a funnel, whose aperture area at the upper end portion coupled to the cleaning vessel 1 is greater than that at the lower end portion coupled to the exhaust duct 7, wherein the intermediate portion of the second exhaust guide pipe 12 connecting the upper and lower portions is tapered. As is apparent from FIG. 2, the first exhaust guide pipe 11 extends through the central portion of the second exhaust guide pipe 12, and is supported and secured, at the portion near the upper end thereof, to the lower interior surface of the cleaning vessel 1 by means of an annular disk-shaped flow adjustment plate 13, and, at the portion near the lower end thereof, to the interior surface of the exhaust duct 7 by means of a plurality of fixing members 14. In the flow adjustment plate 13 are formed a multitude of axially extending through-holes, through which the interior of the cleaning vessel 1 situated above the flow adjustment plate 13 communicates with the interior of the second exhaust guide pipe 12 situated below the flow adjustment plate 13. By changing the aperture area of the through-holes in the flow adjustment plate 13, the flow amount of the fluid including the frozen particles 5, etc., which passes through the flow adjustment plate 13 can be adjusted; it is preferred that the ratio of the aperture area to the total area of the flow adjustment plate 13 is adjusted in such a manner that the aperture area of the through-holes thereof becomes substantially equal to the aperture area of the first exhaust guide pipe 11, thereby equalizing the flow amount through the first exhaust guide pipe 11 and that through the flow adjustment plate 13. Further, the flow adjustment plate 13 has the function of supressing the inverse flow of the frozen particles 5 and the contaminants, such as dust, which have once passed through the through-holes thereof from above to below (i.e., from the side of cleaning vessel 1 to the second exhaust guide pipe 12).

When, in the case of this embodiment, the jet of the carrier gas including the frozen particles 5 which have been discharged from the jet means 6 is blasted against the surface of the object 2 such as a semiconductor wafer fixed on the support portion 3a of the support means 3, the frozen particles 5 collide with the surface of the cleaned object 2 to scrub off contaminants such as dust adhered thereto, thereby cleaning it. The jet flow, including the frozen particles 5 colliding with and bouncing off from the cleaned object 2, or the contaminants scrubbed off from the surface of the cleaned object 2, are sucked by means of the operation of the exhaust blower 8 into the upper end of the first exhaust guide pipe 11 disposed immediately below the support portion 3a, and passed through the interior of the first exhaust guide pipe 11, to flow into the exhaust duct 7 and are exhausted therefrom to the exterior. Since, at this juncture, the upper end of the first exhaust guide pipe 11 is disposed near and immediately below the support portion 3a, most of the debris which has come loose from the surface of the object 2 is sucked rapidly into the upper end of the first exhaust guide pipe 11, proceeding smoothly along the surface of the cleaned object 2 together with any contaminants which have been scrubbed off from the cleaned object 2.

Further, any debris in the frozen particles 5 which was not sucked into the first exhaust guide pipe 11 and thus is scattered therearound flows into the second exhaust guide pipe 12 via the through-holes of the flow adjustment plate 13 disposed around the upper end of the first exhaust guide pipe 11, and thus is exhausted therefrom to the outside via the exhaust duct 7. In this connection, if, for example, the aperture area of the annular space between the lower end interior side surface of the tapered second exhaust guide pipe 12 and the exterior side surface of the first exhaust guide pipe 11 is selected at about one tenth (1/10) of the aperture area of the first exhaust guide pipe 11, then, not only the atmosphere in the neighborhood of the cleaned object 2 can be exhausted efficiently, but also the peripheral atmosphere therearound can be exhausted slowly and by degrees, without developing upward or turbulent flows of the jet around the cleaned object 2.

Figure 3:
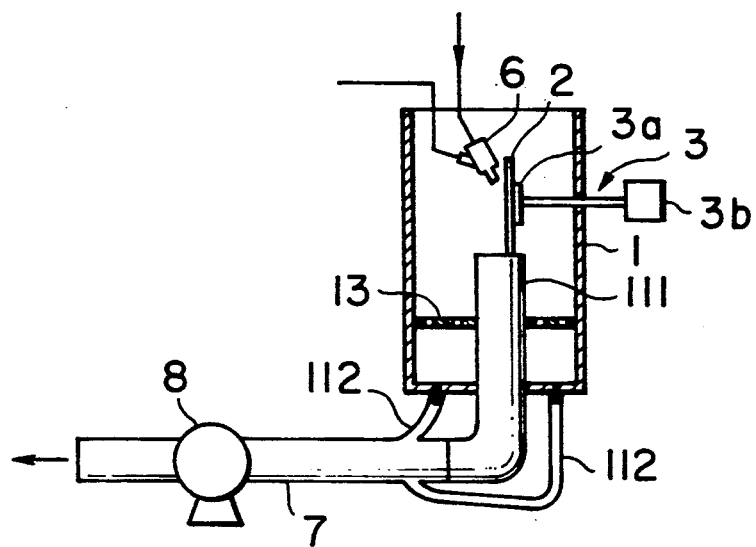
FIG. 3 is also a view similar to that of FIG. 1, but showing a cleaning device according to a second embodiment of this invention.

FIG. 3 shows a second embodiment according to this invention. According to the second embodiment, the first exhaust means consists of first exhaust guide pipe 111 whose diameter is equal to that of the exhaust duct 7, wherein the upper end of the first exhaust guide pipe 111 is disposed near and immediately below the support portion 3a of the support means 3, while the lower end thereof is coupled integrally to the exhaust duct 7. On the other hand, the second exhaust means consists of a plurality of second exhaust guide pipes 112, whose upper ends open into the interior of the cleaning vessel 1 surrounding the first exhaust guide pipe 111, i.e., to the bottom portion of the cleaning vessel 1 around the first exhaust guide pipe 111, and whose lower ends are coupled to the exhaust duct 7 and open thereinto. In this case, it is preferred that the second exhaust guide pipes 112 are disposed circumferentially equally around the first exhaust guide pipe 111, and that the exhaust flow amounts through the respective second exhaust guide pipes 112 are made equal to each other. Thus, although not shown in the figure, it is preferred that either the lengths of the pipes are selected equal to each other, or, in the case where the pipe lengths are different from each other, the inner diameters of the respective pipes are varied, or flow adjustment valves are disposed at the intermediate portions of the respective pipes. By means of such structure, the atmosphere within the cleaning vessel 1 around the first exhaust guide pipe 111 can be exhausted effectively and uniformly via the plurality of second exhaust guide pipes 112, whose upper ends are coupled to the bottom of the cleaning vessel 1.

By the way, near the upper end of the first exhaust guide pipe 111 is disposed a flow adjustment plate 13 as in the case of the first embodiment, such that the upper end of the first exhaust guide pipe 111 is fixed by means of the flow adjustment plate 13 to the interior side surface of the cleaning vessel 1.

In the case of the second embodiment, the atmosphere within the cleaning vessel 1 around the first exhaust guide pipe 111 can be exhausted uniformly via the plurality of the second exhaust guide pipes 112 coupled to the bottom of the cleaning vessel 1; thus, there is no need to taper the bottom of the cleaning vessel 1; as a result, the height (i.e., the length) of the cleaning vessel 1 can be reduced by the length corresponding thereto, and hence the whole cleaning device can be rendered more compact.

By the way, in the case where the angle $\theta$ (see FIG. 4) of the jet of the frozen particles 5 with respect to the surface of the cleaned object 2 is great, or where the surface of the cleaned object 2 is soft, the frozen particles 5 ejected from the jet means 6 are reflected and bounce off from the surface of the cleaned object 2 rather than proceeding therealong in a sliding movement. Hence, there are cases where the bouncing off or reflection of the frozen particles 5 cannot be suppressed with sufficient effectiveness even by means of the provision of the first exhaust guide pipe 11 or 111 and the second exhaust guide pipe(s) 12 or 112 which are provided in the case of the first or second embodiment.

Figure 4:
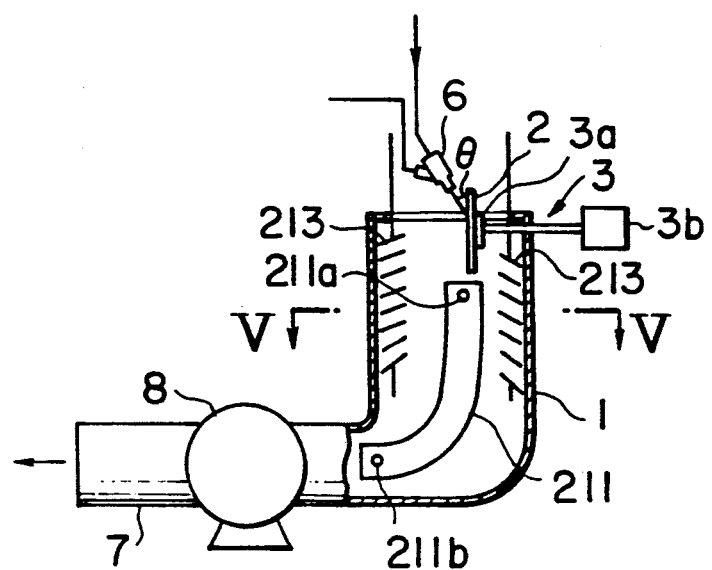
FIG. 4 is also a view similar to that of FIG. 1, but showing a cleaning device according to a third embodiment of this invention.
Figure 5:
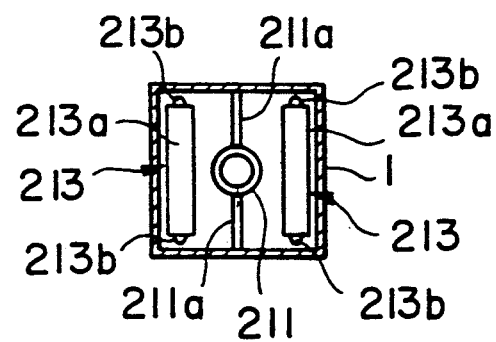
FIG. 5 is a horizontal sectional view along line V—V of FIG. 4.

Thus, FIGS. 4 and 5 show a third embodiment according to this invention which resolves that problem. In the case of the third embodiment, as shown in FIGS. 4 and 5, a pair of scatter prevention members 213 having the form of blades are disposed within the cleaning vessel 1 at both sides of the object 2 and the support portion 3a, in directions in which the frozen particles 5 are scattered. The pair of the scatter prevention members 213 each consist of a multitude of plate members 213a spaced from each other substantially equally along the vertical direction and arranged parallel to each other in the form a louver, wherein the respective ends of the plate members 213a are coupled to each other by means of a pair of support bars 213b, which are coupled to the upper end of the cleaning vessel 1.

By the provision of the scatter prevention members 213 as described above, when, after the frozen particles 5 are ejected and collide against the surface of the object 2 such as a semiconductor wafer, the debris thereof is scattered from the surface of the cleaned object 2 together with the scrubbed off contaminants, and the debris and the contaminants are caught by the louver-shaped scatter prevention members 213, and hence do not reach or adhere to the interior surface of the cleaning vessel 1. In this connection, by adjusting the disposition angle of the scatter prevention members 213 with respect to the object 2 to an appropriate value, the above-mentioned catching effect or scatter preventing effect can further be enhanced. Furthermore, since the scatter prevention members 213 are effective in catching and attenuating the flow velocity of the jet flow of the carrier gas and the frozen particles 5 that bounces off the surface of the cleaned object 2, the upward or turbulent flows of the jet within the cleaning vessel 1 around the cleaned object 2 can more effectively be suppressed.

Further, in the case of the third embodiment, the upper end of the substantially J-shaped first exhaust guide pipe 211 is included in the first exhaust means and opens near and immediately below the support portion 3a of the support means 3, the lower end thereof opening into the exhaust duct 7; in addition, the first exhaust guide pipe 211 is fixed and supported, at the upper and lower end thereof, to the interior side surface of the cleaning vessel 1 and the interior side surface of the exhaust duct 7, via the fixing members 211a and 211b, respectively. Furthermore, the lower end of the cleaning vessel 1 is coupled integrally to one end of the exhaust duct 7, the second exhaust means including the lower interior side surface of the cleaning vessel 1 and the exterior side surface of first exhaust guide pipe 211.

Also in the case of the third embodiment, the first and the second exhaust means including the first exhaust guide pipe 211 operate in ways similar to those in the case of the first and the second embodiments described above.

It is noted that the scatter prevention members similar to those of the third embodiment can be disposed in the cleaning device according to the first and the second embodiments.

While description has been made of the particular embodiments of this invention, it will be understood that many modifications may be made without departing from the spirit thereof, and the appended claims are contemplated to cover any such modifications as fall within the true spirit and scope of this invention.

What is claimed is:

1. A cleaning device for an object having a surface to be cleaned comprising:

a cleaning vessel;

support means, including a support portion, for supporting an object to be cleaned within the cleaning vessel;

frozen particle supply means for supplying frozen particles to the cleaning vessel;

jet means, disposed in the cleaning vessel and receiving frozen particles from the frozen particle supply means, for ejecting the frozen particles to collide with the object to be cleaned supported by the support means and thereby remove contaminants from the object;

an exhaust duct for exhausting from within the cleaning vessel frozen particles ejected from the jet means that collided with the object and contaminants removed from the object;

exhaust blower means, coupled to the exhaust duct, for forcibly sucking frozen particles and contaminants from within the cleaning vessel and exhausting them outside of the cleaning vessel;

first exhaust means disposed between and communicating with the cleaning vessel and the exhaust duct for guiding from the cleaning vessel to the exhaust duct frozen particles and contaminants proximate the support portion of the support means within the cleaning vessel; and second exhaust means disposed between and communicating with the cleaning vessel and the exhaust duct for guiding from the cleaning vessel to the exhaust duct frozen particles and contaminants not proximate the support portion of the support means and within the cleaning vessel, wherein the first exhaust means is at least partially disposed within the second exhaust means.

2. A cleaning device as claimed in claim 1, wherein:

the first exhaust means comprises a first exhaust guide pipe having first and second ends, the first end opening in the cleaning vessel proximate the support portion of the support means and the second end opening into the exhaust duct; and the second exhaust means comprises a second exhaust guide pipe surrounding the first exhaust guide pipe and having first and second ends, wherein the first end of the second exhaust guide pipe is coupled to the cleaning vessel and the second end of the second exhaust guide pipe is coupled to the exhaust duct.

3. A cleaning device as claimed in claim 2, wherein the first end of the second exhaust guide pipe coupled to the cleaning vessel has a larger cross-sectional area than the second end of the second exhaust guide pipe coupled to the exhaust duct and the second exhaust guide pipe is tapered in cross-sectional area between the first and second ends of the second exhaust pipe.

4. A cleaning device as claimed in claim 1, wherein:

the first exhaust means comprises a first exhaust guide pipe having first and second ends, wherein the first end opens in the cleaning vessel proximate the support portion of the support means and the second end is coupled to the exhaust duct; and the second exhaust means comprises a plurality of second exhaust guide pipes, each having first and second ends, wherein the first ends of the second exhaust guide pipes open in the cleaning vessel peripherally disposed around the first exhaust guide pipe and the second ends of the second exhaust guide pipes are coupled to the exhaust duct.

5. A cleaning device as claimed in claim 4, wherein the first ends of the plurality of second exhaust guide pipes are disposed uniformly around the first exhaust guide pipe.

6. A cleaning device as claimed in claim 5, wherein flow rates of exhaust flows flowing through respective second exhaust guide pipes are substantially equal to each other.

7. A cleaning device as claimed in claim 2, including a flow adjustment plate disposed between the first exhaust guide pipe and the cleaning vessel.

8. A cleaning device as claimed in claim 1, including a scatter prevention member having parallel blades disposed within the cleaning vessel proximate the support portion of the support means to prevent frozen particles that have collided with the object from bouncing back onto the object.

9. A cleaning device as claimed in claim 4, including a flow adjustment plate disposed between the first exhaust guide pipe and the cleaning vessel.

10. A cleaning device as claimed in claim 2, including a scatter prevention member having parallel blades disposed within the cleaning vessel proximate the support portion of the support means to prevent frozen particles that have collided with the object from bouncing back onto the object.

11. A cleaning device as claimed in claim 4, including a scatter prevention member having parallel blades disposed within the cleaning vessel proximate the support portion of the support means to prevent frozen particles that have collided with the object from bouncing back onto the object.

* * * * *